United States Patent [19]
North et al.

[11] Patent Number: 5,828,409
[45] Date of Patent: Oct. 27, 1998

[54] FILM SCANNER MOUNT ASSEMBLY FOR A SOLID STATE SENSOR

[75] Inventors: Stephen Palmer North; Bruce E. Rottner, both of Rochester, N.Y.

[73] Assignee: Eastman Kodak Company, Rochester, N.Y.

[21] Appl. No.: 631,593

[22] Filed: Apr. 12, 1996

[51] Int. Cl.⁶ ............................. H04N 5/225; H04N 3/36
[52] U.S. Cl. ............................. 348/374; 348/96; 348/97; 358/483
[58] Field of Search ............................. 348/96, 97, 107, 348/110, 374, 65, 207, 76; 358/482, 483; 361/807–812, 791, 785, 786, 787, 767, 742, 770; 174/260, 138 G; H04N 5/225, 3/36, 3/38, 3/40, 3/14

[56] References Cited

U.S. PATENT DOCUMENTS

| | | | |
|---|---|---|---|
| 3,982,979 | 9/1976 | Hentz et al. | 156/73.6 |
| 4,217,024 | 8/1980 | Aldridge et al. | 439/381 |
| 4,346,291 | 8/1982 | Chapel, Jr. et al. | 327/348 |
| 4,457,017 | 6/1984 | Onogi et al. | 358/483 |
| 4,534,804 | 8/1985 | Cade | 148/1.5 |
| 4,591,901 | 5/1986 | Andrevski | 348/374 |
| 4,594,613 | 6/1986 | Shinbori et al. | 358/213 |
| 4,677,471 | 6/1987 | Takamura et al. | 348/76 |
| 4,803,557 | 2/1989 | Bridges | 358/229 |
| 5,173,759 | 12/1992 | Murano | 257/88 |
| 5,267,043 | 11/1993 | Rottner et al. | 348/104 |
| 5,559,556 | 9/1996 | Kageback | 348/374 |

*Primary Examiner*—Andrew I. Faile
*Assistant Examiner*—Gene N. Auduong
*Attorney, Agent, or Firm*—Francis H. Boos, Jr.

[57] ABSTRACT

Mounting of a solid state imaging sensor in a film scanner support body with an axis of the sensor in precision alignment with a scan axis of the scanner. The sensor is precision mounted on a support frame forming part of a sensor package with the sensor axis aligned with a line of sensor leads extending from the sensor support frame. The sensor package is then mounted on a scanner support body with the sensor leads abutting an insulator material reference datum surface that holds the sensor axis in precision alignment relative to a film scan axis.

6 Claims, 3 Drawing Sheets

FILM SCANNER MOUNT ASSEMBLY FOR A SOLID STATE SENSOR

FIELD OF THE INVENTION

This invention relates to a structure for the mounting of a solid state imaging device in a film image scanner assembly.

BACKGROUND OF THE INVENTION

Precise alignment of a solid state imaging sensor array, e.g. a linear or two dimension array CCD, in a film image scanner is necessary to assure accurate registration of the linearly aligned photosites in the sensor with the cross scan direction of the film image being scanned. For precise alignment, an active method has been employed in which the signal output from the sensor is monitored as the orientation of the sensor package is adjusted in the film scanner mount. Once in the correct position, the CCD package would be fixed in place. While this approach is an accurate procedure, it is time consuming and requires costly fixtures to implement. It is also not well suited to sensor replacement in the field.

In U.S. Pat. No. 4,594,613, a two dimensional sensor array is precision mounted within the sensor package by means of a three point peripheral contact formed in a mounting plate such that the sensor array is precision located relative to two locating holes formed in the mounting plate. The package is then mounted directly onto a lens barrel which has two alignment locating pins that mate with the locating holes in the sensor mounting plate. Such an arrangement requires an extremely tight fit between the locating holes and pins and results in an overconstrained configuration that is inherenlty difficult to assemble. It also requires that the sensor package be directly mounted on the support body, in this case a lens barrel. In many cases, such as is true with film scanners, the sensor is mounted onto a printed circuit board and the board, not the sensor package, is then mounted onto the support body. Consequently, precision locator holes in the sensor package cannot be conveniently employed to precision align the sensor on the support body.

SUMMARY OF THE INVENTION

In accordance with the invention, therefore, there is provided a film scanner mount assembly for a solid state sensor which comprises a sensor package having a solid state sensor, a sensor support frame and a line of sensor leads extending from said frame. The sensor is mounted within the frame with one axis of the sensor being in precision alignment with the line of sensor leads. The mount assembly further comprises a sensor package metallic support body having a film track, a scanning aperture and a plurality of reference datum surfaces defining a predetermined aligned position of the sensor relative to the scanning aperture, at least one of the datum surfaces comprising an insulator material. The sensor package is mounted within the support body in abutment with the reference surfaces, the line of sensor leads being in abutment with the insulator material reference surface so that the one axis of the sensor is thereby placed in the predetermined aligned position relative to the scanning aperture by virtue of said precision alignment of the sensor with the sensor leads.

DETAILED DESCRIPTION OF THE INVENTION

Figure 1:
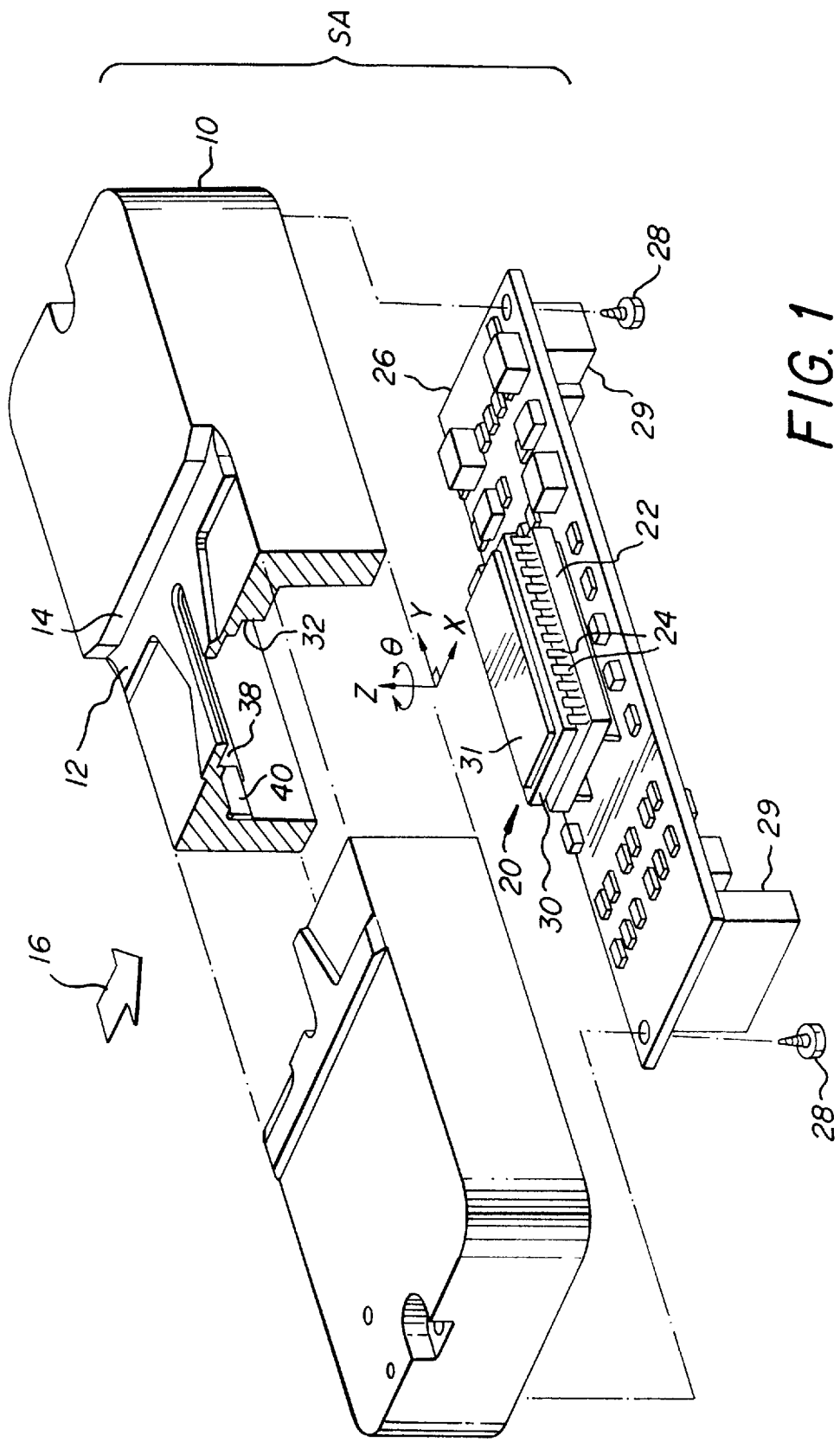
FIG. 1 is a perspective exploded view of a film scanner sensor assemble constructed in accordance with the present invention.
Figure 2:
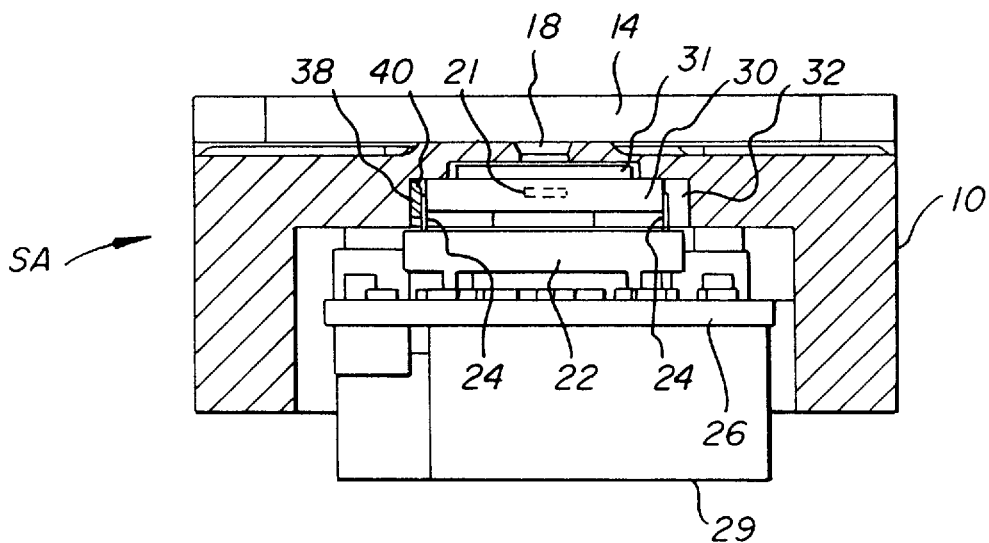
FIG. 2 is an end cutaway view of the assembly of FIG. 1.

Referring to FIGS. 1 and 2, the film scanner mount assembly SA of the invention includes a sensor package 20 and a metallic support body 10 adapted to be mounted in conventional manner on a film transport mechanism (not shown) of film scanner equipment. Sensor package is shown removably mounted on a conventional DIP socket 22 by means of sensor leads 24. DIP socket 22 is, in turn, mounted in conventional manner on a printed wiring board 26. The printed wiring board is secured to the support body 10 by means of bolts or screws 28. Plug sockets 29 are provided for electrical connection via suitable cables to the main scanner equipment. Sensor package 20 includes solid state imaging sensor 21, a sensor support frame 30 to which the sensor 21 is adhesively secured and a glass plate 31 to hermetically seal sensor 21 within the sensor frame. A line of sensor leads 24 extends from each elongated side of the support frame 30 in conventional manner. In accordance with an aspect of the invention, sensor 21 is mounted within the package 20 with an elongated axis of the sensor, corresponding to the cross scan axis of the film image, in precision alignment with one of the lines of sensor leads 24 as will be described in more detail subsequently.

Figure 3:
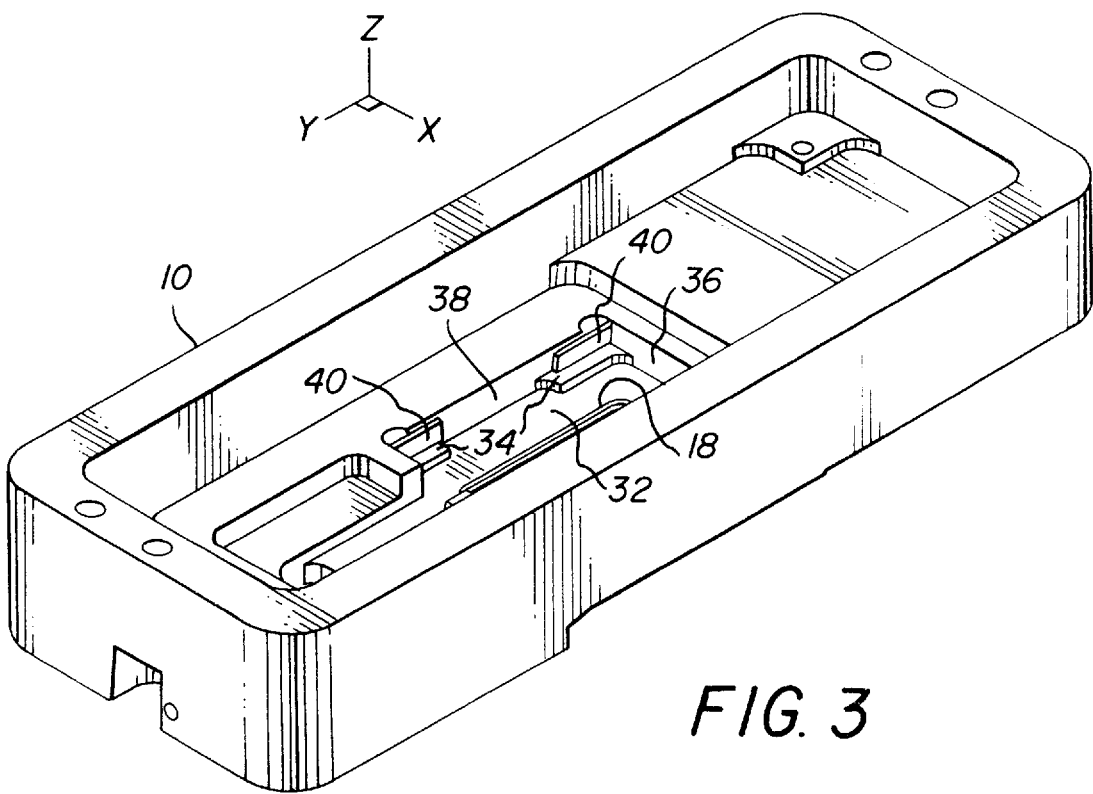
FIG. 3 is a perspective view of the underside of the support body of the assembly of FIG. 1.
Figure 4:
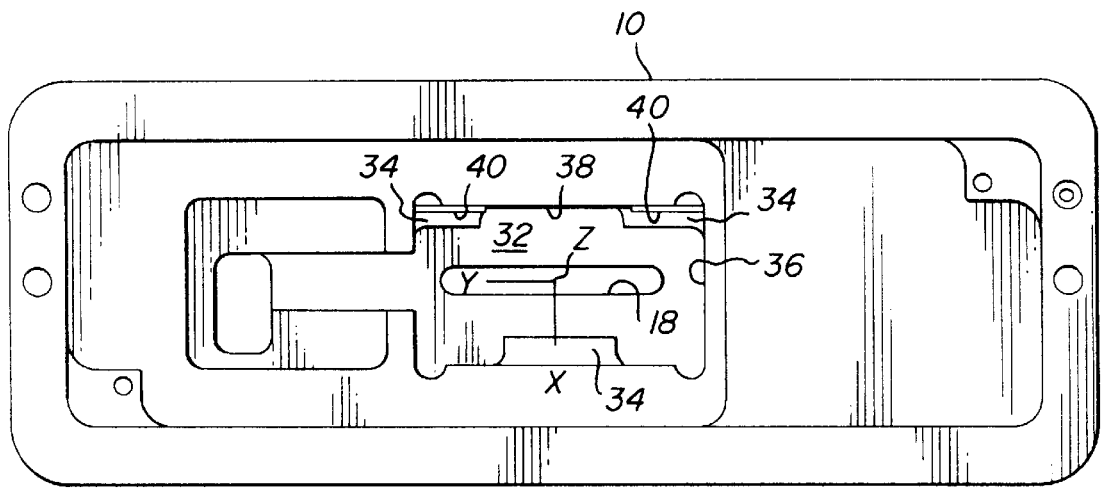
FIG. 4 is a plan view of the support body of FIG. 3.

Support body 10 is provided with a film track 12 formed in the top thereof, the track having a raised edge 14 which guides the film (not shown) as it is transported longitudinally through the track in the direction of arrow 16. A scanning aperture 18 extends in the cross scan (lateral) direction of the film image to allow light from a scan light housing (not shown) to expose the film image onto the solid state imaging sensor 21 positioned beneath the aperture 18. As best seen in FIGS. 3 and 4, the underside of support body 10 is provided with a cavity 32 for receiving the sensor package 20 when the printed wiring board is assembled to the support body. The cavity is preferably precision machined to provide a plurality of reference surfaces that are used to align the sensor package 20 and, by extension, the sensor 21 in the scanner assembly. Horizontal mounting surfaces 34 are provided to constrain the sensor package within support body in the Z direction at a fixed distance from the film track 12. Two sides 36,38 of the cavity provide reference surfaces for precision alignment of the sensor package 20 in the X, Y and θZ axes. With the sensor package 20 and printed wiring board 26 mounted into the support body 10, the shorter end surface 36 of the cavity serves as a reference datum surface for the end of the sensor package 20 constraining the package along the X axis. The longer side 38 serves indirectly as the reference datum surface constraining the sensor package along the Y axis which corresponds to the elongated axis of aperture 18. A pair of insulative pads 40, preferably made of a ceramic material, are adhesively secured to the side 38 to insulate the sensor leads from contact with the support body which is typically formed of a metal material. Since the sensor leads 24 of the sensor package abut these pads, the pads serve directly as the reference surface for aligning the sensor package 20 so that the elongated axis of sensor 21 is placed in the desired aligned position relative to the scanning aperture by virtue of the precision alignment of the sensor with the sensor leads.

Figure 5:
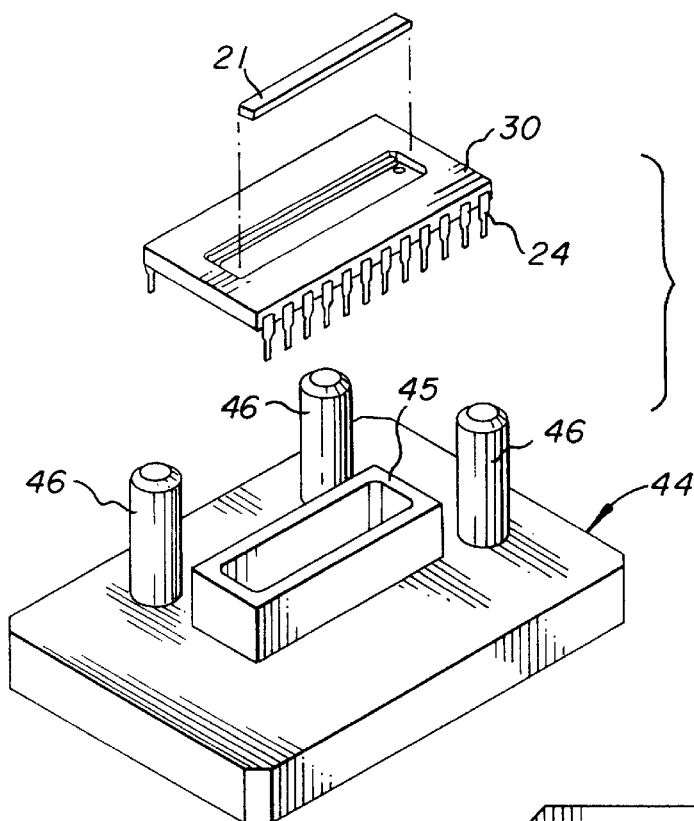
FIG. 5 is a perspective view of a jig fixture used in achieving precision alignment of the imager sensor in the sensor package.
Figure 6:
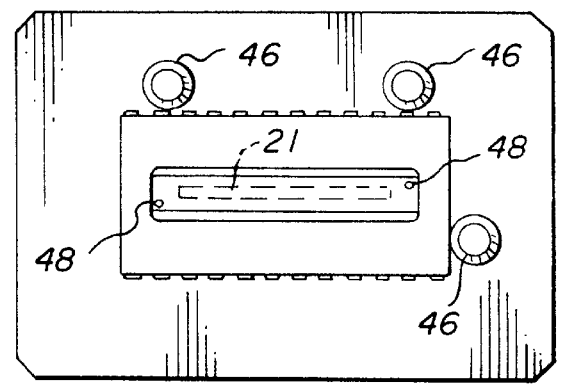
FIG. 6 is a plan view of the jig fixture of FIG. 5.

Although it might seem that locating the sensor package by abutting the sensor leads against the reference datum surface would not provide adequate location control, it has been found that any variation in positioning of the sensor package that might occur is compensated for by the method used for placement of the sensor active element within the sensor package which will now be described with reference to FIGS. 5 and 6. A jig fixture 44 is provided with a vacuum platform to hold the sensor frame in place. A trio of pins 46 extend upwardly from the fixture to provide reference datums which are precision located to correspond to reference datum surfaces provided by the cavity end surface 36 and the side contact surfaces of the ceramic pads 40 in cavity 32 of the support body 10. When the sensor support frame 30 is placed on the vacuum platform 45 and urged against the locator pins 46, a vacuum is drawn on the platform to hold the frame 30 in place while positioning marks 48 are cut into the frame by a laser beam device (not shown) to provide precise location guides for adhesive mounting of the sensor 21 on the surface of the sensor frame 30. It will be appreciated that by virtue of location of the positioning marks 48 with the sensor leads 24 in place against the locator pins 46, a precision location of the active sensor element 21 is achieved relative to the refence datum surfaces of the support body and, by extension, with the desired orientation of the active element to the cross scan axis of the scanner assembly, irrespective of any non-uniformities of the sensor leads 24 on the sensor support frame 30. Moreover, the ease of assembly of the sensor package 20 in the support body 10 is facilitated by use of the cavity reference datum surfaces as opposed to the use of mating alignment pins on the support body 10 and locator holes on the sensor package which would require a tight fit therebetween to achieve similar precsion in alignment of the sensor.

The invention has been described with reference to a preferred embodiment. However, it will be appreciated that variations and modifications can be effected by a person of ordinary skill in the art without departing from the scope of the invention. For example, the illustrated embodiment utilizes a linear scanner element and it will be appreciated that a two dimensional scanner array may be substituted therefor.

PARTS LIST

SA scanner assembly
10 support body
12 film track
14 film track edge guide
16 arrow—film transport direction
18 scanning aperture
20 imaging sensor package
21 solid state imaging sensor
22 DIP socket
24 sensor leads
26 printed wiring board
28 screws/bolts
29 plug sockets
30 sensor support frame
32 cavity
34 horizontal mounting surface
36 end reference surface
38 side reference surface
40 ceramic pads
44 jig fixture
45 vacuum platform
46 jig fixture locator pins
48 laser cut locator marks

What is claimed is:

1. A film scanner mount assembly for a solid state sensor comprising:

a sensor package comprising a solid state sensor, a sensor support frame and a line of external sensor leads extending from said frame, the sensor being mounted within said frame with one dimension of the sensor being in precision alignment with the line of sensor leads; and a sensor package metallic support body having a film track, a scanning aperture oriented in a cross scan direction of an image on film in the film track and a plurality of reference datum surfaces defining a predetermined lateral alignment position of the sensor relative to the scanning aperture, at least one of the datum surfaces comprising an insulator material;

the sensor package being mounted within the support body in abutment with said reference surfaces, the line of sensor leads being in abutment with the insulator material reference surface so that at least one axis of the sensor is thereby placed in said predetermined aligned position relative to the scanning aperture by virtue of said precision alignment of the sensor with the sensor leads.

2. The assembly of claim 1 further comprising a printed circuit board having a socket for receiving and mounting the sensor package on the board, the board being mounted to the support body.

3. The assembly of claim 1, the support body having a cavity for receiving the sensor package, two sides of the cavity comprising two of said reference surfaces.

4. The assembly of claim 3 wherein one of said cavity sides has a pair of insulator pads secured thereto to form a pair of reference datums against which the line of sensor leads abut to hold said one sensor axis in alignment with said scanning aperture.

5. The assembly of claim 4 wherein said scanning aperture is a slot having an elongated axis and said sensor is a linear sensor having an elongated axis adapted to be in precision alignment with said aperture axis when said sensor leads are in abutment with said insulator material datum surface.

6. A method of precision mounting a solid state imaging sensor in a support body of a film scanner, the imaging sensor being part of a sensor package having a line of sensor leads extending along at least side thereof, the method comprising the steps of:

mounting an elongated axis of the imaging sensor in the sensor package in precision alignment with said line of sensor leads extending from the package;

securing said sensor package to an intermediate support means; and securing said intermediate support means to the support body with said sensor package received in a cavity of the support body such that said line of sensor leads is urged against a reference datum surface comprised of insulator material.

* * * * *

UNITED STATES PATENT AND TRADEMARK OFFICE
CERTIFICATE OF CORRECTION

PATENT NO. : 5,828,409
DATED : October 27, 1998
INVENTOR(S) : Stephen P. North, et al It is certified that error appears in the above-identified patent and that said Letters Patent is hereby corrected as shown below:

Title Page, insert --[60] U.S. Provisional Application Serial No. 60/000,595, filed June 30, 1995 --

Column 1, Line 3 -- CROSS REFERENCE TO RELATED APPLICATION; Reference is made to and priority claimed from U.S. Provisional Application Serial No. 60/000,595, filed June 30, 1995, entitled FILM SCANNER MOUNT ASSEMBLY FOR A SOLID STATE SENSOR --

Signed and Sealed this

Sixteenth Day of March, 1999

*Attest:*

Q. TODD DICKINSON

*Attesting Officer*   *Acting Commissioner of Patents and Trademarks*